(12) United States Patent
Bash et al.

(10) Patent No.: US 8,727,227 B2
(45) Date of Patent: May 20, 2014

(54) OPTIMIZING FLUID FLOW DISTRIBUTION IN A STRUCTURE

(75) Inventors: Cullen E. Bash, Los Gatos, CA (US); Abdlmonem Beitelmal, Los Altos, CA (US); Ratnesh Kumar Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 735 days.

(21) Appl. No.: 13/000,322

(22) PCT Filed: Jun. 30, 2008

(86) PCT No.: PCT/US2008/068780
§ 371 (c)(1),
(2), (4) Date: Dec. 20, 2010

(87) PCT Pub. No.: WO2010/002385
PCT Pub. Date: Jan. 7, 2010

(65) Prior Publication Data
US 2011/0101116 A1 May 5, 2011

(51) Int. Cl.
*G05D 23/00* (2006.01)
(52) U.S. Cl.
USPC .............................. 236/94; 700/276; 62/259.2
(58) Field of Classification Search
CPC ................... F24F 2011/0009; F24F 2011/001; F24F 2011/0012; F24F 2011/0091; G05D 23/00; G05D 23/122
USPC .............. 236/49.3, 94; 700/276–278; 62/125, 62/259.2
See application file for complete search history.

(56) References Cited

U.S. PATENT DOCUMENTS

| | | | |
|---|---|---|---|
| 4,931,948 A | 6/1990 | Parker et al. | |
| 5,101,643 A * | 4/1992 | Hicke | 62/407 |
| 6,411,856 B1 * | 6/2002 | Takeuchi et al. | 700/3 |
| 6,574,104 B2 | 6/2003 | Patel et al. | |
| 7,051,946 B2 | 5/2006 | Bash et al. | |
| 7,117,129 B1 | 10/2006 | Bash et al. | |
| 7,894,944 B2 * | 2/2011 | Liu et al. | 700/276 |
| 7,995,339 B2 * | 8/2011 | Bash et al. | 361/692 |
| 8,239,046 B2 * | 8/2012 | Koehler et al. | 700/19 |
| 2006/0214014 A1 | 9/2006 | Bash et al. | |
| 2008/0154534 A1 | 6/2008 | Bash et al. | |

FOREIGN PATENT DOCUMENTS

JP 11218354 8/1999
WO WO-2004051156 6/2004

OTHER PUBLICATIONS

U.S. Appl. No. 11/699,402, entitled "Computerized Tool for Assessing Conditions in a Room", filed Jan. 29, 2007.
PCT/US2008/068780 SR dated Jan. 29, 2009.

* cited by examiner

*Primary Examiner* — Marc Norman

(57) ABSTRACT

In a method for determining a substantially optimized fluid flow distribution in a structure configured to be cooled by a fluid moving device, an indication to activate the fluid moving device according to a reference temperature setpoint of a plurality of sensors is outputted. In addition, conditions detected in multiple areas of the structure with the plurality of sensors are received, a master sensor among the plurality of sensors based upon the detected conditions is identified; and a master reference temperature setpoint for the master sensor that substantially optimizes fluid flow distribution in the structure based upon conditions detected by the plurality of sensors in response to changes in a characteristic of fluid flow supplied to the plurality of sensors is determined.

15 Claims, 9 Drawing Sheets

OPTIMIZING FLUID FLOW DISTRIBUTION IN A STRUCTURE

CROSS-REFERENCES

The present application has the same Assignee and shares some common subject matter with U.S. Pat. No. 6,574,104, entitled "Smart Cooling of Data Centers", issued on Jun. 3, 2003, U.S. patent application Ser. No. 10/078,087, entitled "Commissioning of Sensors", filed on Mar. 11, 2005, U.S. patent application Ser. No. 11/644,158, entitled "Apparatus State Determination Method and System", filed on Dec. 22, 2006, U.S. patent application Ser. No. 11/699,402, entitled "Computerized Tool for Assessing Conditions in a Room", filed on Jan. 29, 2007, and U.S. Pat. No. 7,051,946, entitled "Air Recirculation Index", issued on May 30, 2006, the disclosures of which are hereby incorporated by reference in their entireties.

BACKGROUND

Air conditioning units are typically employed to cool spaces in multiple types of structures, such as, buildings, data centers, electronics racks, and servers. Oftentimes, the air conditioning units supply cooling airflow to the interiors of the structures through a plenum and ventilation tiles. In addition, some structures include controllers configured to provision cooling resources supplied from the air conditioning units and through the ventilation tiles.

Networks of sensors have also been deployed in various locations within the structures to thus collect data relevant to the various locations. The controllers often interface with and receive data from the sensors in the sensor networks. In addition, the controllers have been known to use the data received from the sensors in controlling either or both of the air conditioning units and the ventilation tiles to substantially maintain the temperatures at the sensors at or below desired temperatures. The sensors are typically set to a common reference temperature setpoint, regardless of their placements in the structures.

It is, however, often less than optimal to set the temperature setpoints to a common reference temperature because of non-uniformity of the airflow in the structures, the arrangement of the equipment deployed in the structures, and the varying levels of heat loads generated by the heat generating components in the structures.

It would therefore be beneficial to be able to identify temperature setpoints for the sensors that enables substantially optimal cooling provisioning to be provided in the structures.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a system and method for determining a substantially optimized fluid flow distribution in a structure configured to be cooled by a fluid moving device. The fluid flow distribution may be considered as being substantially optimized when the amount of energy consumed by the fluid moving device in adequately supplying cooling resources to various areas in the structure is minimized. That is, for instance, substantially optimized fluid flow distribution may be attained when the components, such as, servers, networking equipment, and other hardware, contained in the structure receive sufficient cooling fluid flow to substantially maintain their temperatures within predefined ranges, while also minimizing the amount of power required to supply the sufficient cooling fluid flow to the components.

According to an example, the fluid flow distribution in the structure may substantially be optimized through the setting of one or more master sensors to substantially optimized levels. In addition, the fluid flow distribution may be further optimized through various other changes, such as, changes to the flow characteristics of the fluid supplied from one or more of fluid moving devices, changes to the volume flow rate of fluid delivered through one or more fluid delivery devices, changes to fluid flow through placement of blanking panels in the structure, etc.

Figure 1:
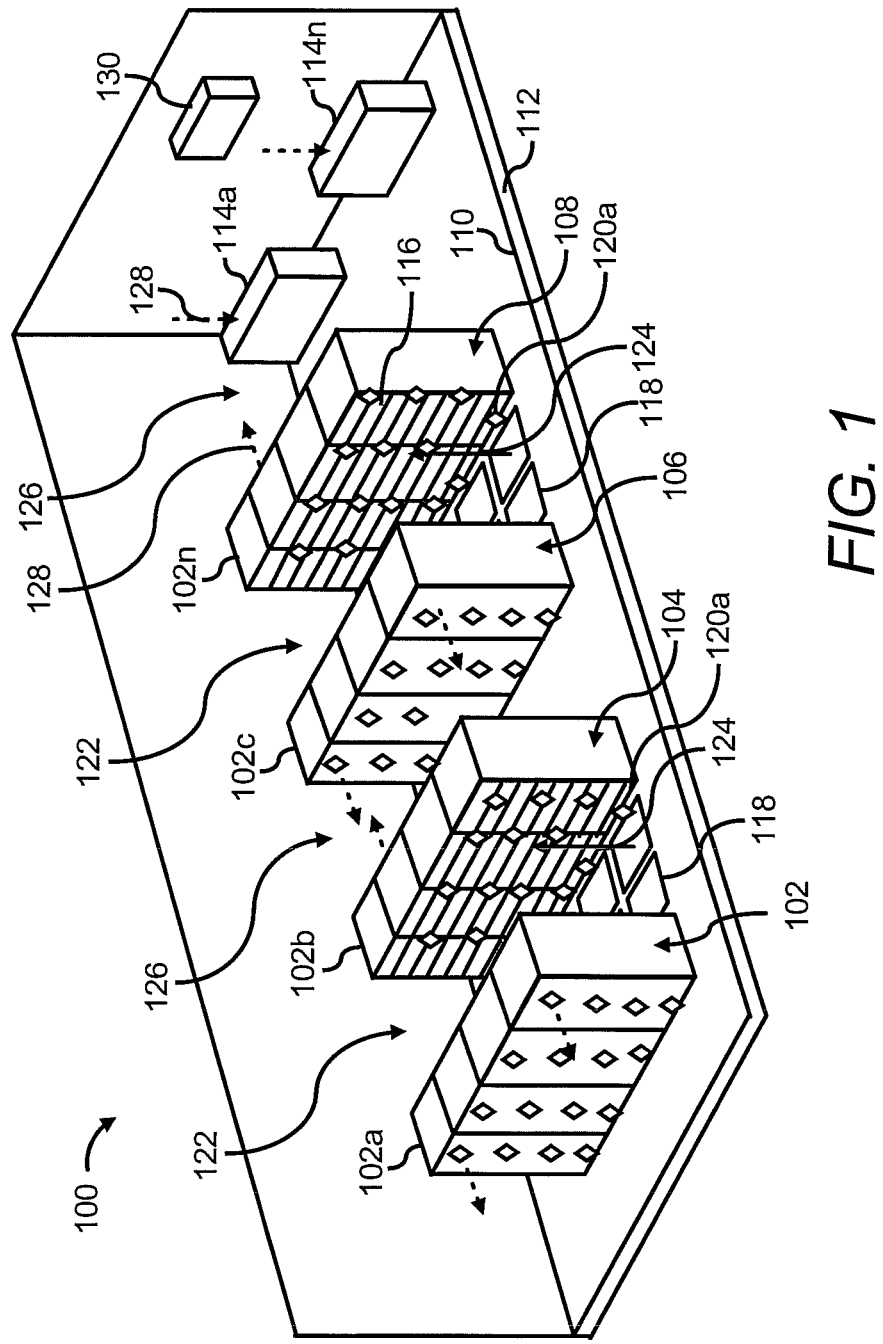
FIG. 1 shows a simplified perspective view of a section of a structure, here a data center, which may employ various examples of a system for determining a substantially optimized fluid flow distribution in a structure, according to an embodiment of the invention.

With reference first to FIG. 1, there is shown a simplified perspective view of a section of a structure 100, here a data center, which may employ various examples of a system for determining a substantially optimized fluid flow distribution in a structure 100 disclosed herein, according to an example. It should be understood that the structure 100 may include additional components and that some or all of the components depicted therein may be removed and/or modified without departing from a scope of the structure 100 disclosed therein.

The structure 100 is depicted as having a plurality of racks 102a-102n, where "n" is an integer greater than one, and is not necessarily equivalent to other values of "n" cited throughout the present disclosure, configured to house electronic devices 116, for instance, computers, servers, bladed servers, disk drives, displays, networking equipment, etc.

The structure 100 includes a raised floor 110, which may function as a plenum for delivery of cooled fluid, such as, air, refrigerant, water, etc., from one or more fluid moving devices 114a-114n, where "n" is an integer equal to or greater than one, and is not necessarily equivalent to other values of "n" cited throughout the present disclosure. When the fluid comprises a gas, such as air or a gaseous refrigerant, the fluid is delivered through vents 118 to the racks 102a-102n. When the fluid comprises a liquid, such as water, a liquid refrigerant, a multi-state refrigerant, etc., the fluid may be delivered to the racks 102a-102n through a series of pipes (not shown).

The fluid moving devices 114a-114n may comprise widely available conventional air conditioning (AC) units, such as, vapor-compression type air conditioning units, chiller type air conditioning units, etc., and may supply fluid flow to a space 112 beneath the raised floor 110 and may cool heated fluid (indicated by the arrows 128).

The fluid moving devices 114a-114n may include, for instance, devices for manipulating fluid flow temperature, such as chillers, heat exchangers, etc., and devices for manipulating the supply flow rates, such as variable frequency devices, blowers, etc., of the cooled fluid. The cooled fluid, indicated by the arrows 124, is delivered from the space 112 to the racks 102a-102n through fluid delivery devices 118 located between some or all of the racks 102a-102n. The fluid delivery devices 118 may comprise, for instance, ventilation tiles, variable fluid flow volume devices, etc., and are shown as being located between rows 104a and 104b and 104c and 104d. It should be understood that the fluid delivery devices 118 and the space 112 may also be positioned on the ceiling or a wall of the structure 100 without departing from a scope of the invention.

Also shown in FIG. 1 are a plurality of sensors 120a-120n, where "n" is an integer greater than one, and is not necessarily equivalent to other values of "n" cited throughout the present disclosure. The sensors 120a-120n may comprise temperature sensors, such as, thermocouples, thermistors, etc., and are represented as diamonds to distinguish them from other elements depicted in FIG. 1. In addition, the sensors 120a-120n are depicted as being positioned to detect the temperatures at various locations near the inlets and the outlets of the racks 102a-102n. Although not shown, the sensors 120a-120n may comprise sensors associated with or integrally manufactured with one or more of the electronic devices 116.

The sensors 120a-120n may be networked with a computing device 130. As described in greater detail below, the computing device 130 may employ one or more of the sensors 120a-120n as "master sensors". According to an example, the computing device 130 may control the fluid moving devices 114a-114n and/or the fluid delivery devices 118 based upon the conditions detected by one or more of the "master sensors". The computing device 130 may rely upon the conditions detected by the master sensors over other sensors 120a-120n because the master sensors may, for instance, be more susceptible to thermal phenomena associated with rack configuration density and sensor 120a location and may thus provide a relatively more accurate indication of the actual conditions around the master sensors. A more detailed description of master (or control) sensors is provided in commonly assigned and co-pending U.S. patent application Ser. No. 10/078,087, entitled "Commissioning of Sensors", filed on Mar. 11, 2005, the disclosure of which is hereby incorporated by reference in its entirety.

Various examples of manners in which selected ones of the sensors 120a-120n may be chosen as the master sensors are also discussed in greater detail herein below. In addition to determining which sensors 120a-120n are considered to be master sensors, various manners in which one or more states of the sensors 120a-120n are determined are also discussed below. More particularly, for instance, various examples are disclosed herein of manners in which the conditions detected by the sensors 120a-120n may be analyzed to determine their states. Additionally, various examples are disclosed herein of manners in which the measurements obtained by the sensors 120a-120n may be analyzed to determine the states of various electronic devices 116 associated with the sensors 120a-120n.

Figure 2A:
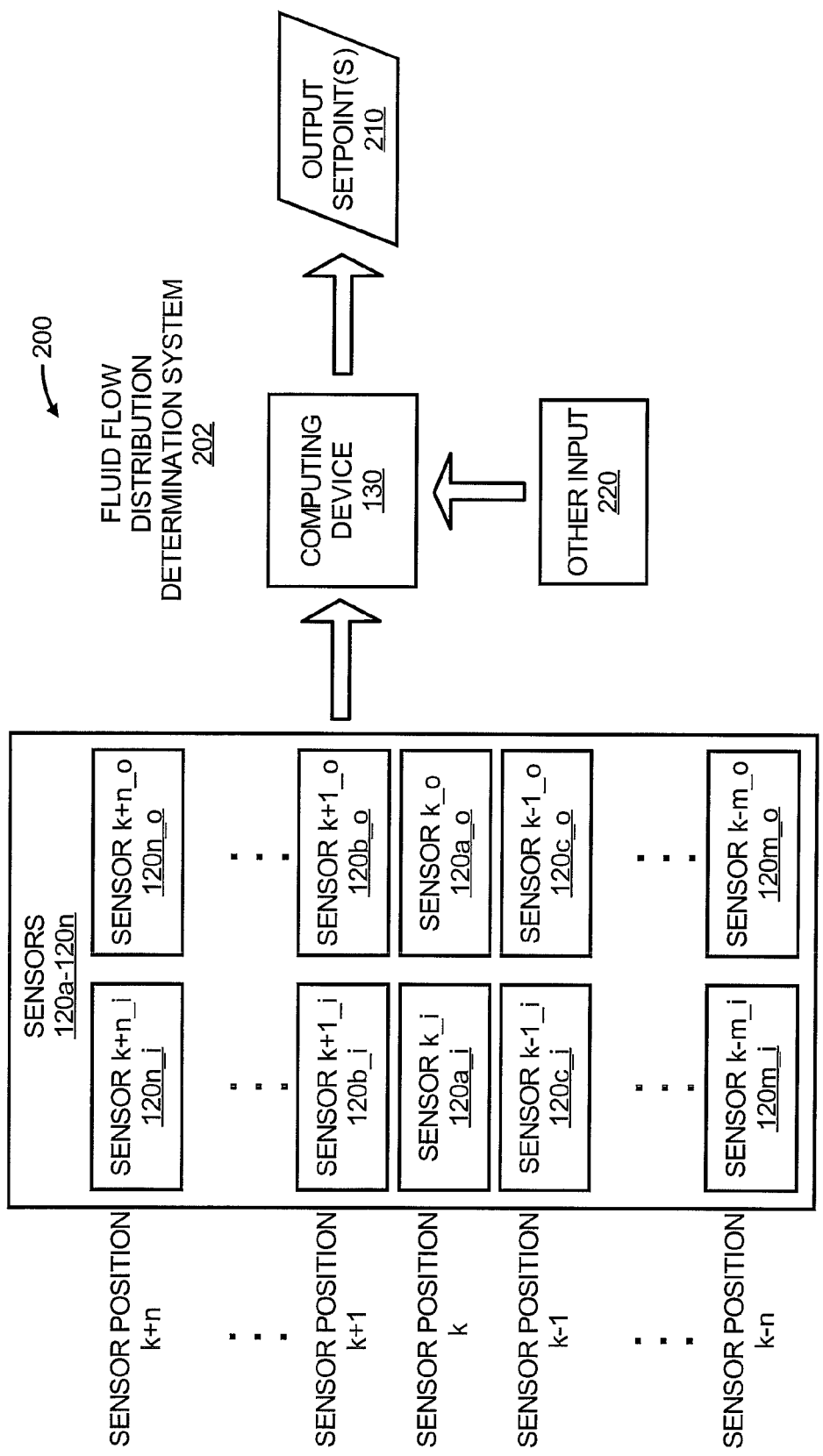
FIG. 2A shows a data flow path of a fluid flow distribution determination system, according to an embodiment of the invention.

With reference now to FIG. 2A, there is shown a data flow path 200 of a fluid flow distribution determination system 202, according to an example. It should be understood that the system 202 may include additional components and that some of the components described herein may be removed and/or modified without departing from the scope of the system 202.

The system 202 includes the computing device 130, which may comprise, for instance, a computer system, a server, etc. In addition, the computing device 130 may comprise a microprocessor, a micro-computing device, an application specific integrated circuit (ASIC), and the like, configured to perform various processing functions. In addition, or alternatively, the computing device 130 may comprise software operating in any of a number of computing devices, including on one or more of the electronic devices 116, the fluid moving devices 114a-114n, etc.

The system 202 is also shown as including a plurality of sensors 120a-120n in a vertical arrangement (k−n to k+n) with respect to each other, which may be similar to the configuration of a plurality of sensors 120a-120n positioned to detect conditions with respect to the electronic devices 116 housed in a rack 102a. The sensors 120a-120n are also depicted in pairs, such that, a plurality of inlet (i) and outlet (o) sensors 120a-120n are positioned to respectively detect conditions at the inlets and outlets of the plurality of electronic devices 116 housed in the rack 102a. In addition, or alternatively, the sensors 120a-120n depicted in FIG. 2A may represent sensors 120a-120n positioned with respect to a plurality of racks 102a-102n.

Although not shown, the sensors 120a-120n may also be associated with the electronic devices 116. In other words, a pair of sensors $120a\_i$ and $120a\_o$ may be considered as being associated with an electronic device 116, if the sensors $120a\_i$ and $120a\_o$ are positioned to detect the inlet and outlet conditions of that electronic device 116 or within respective vicinities of the inlet and outlet of that electronic device 116.

In a first example, the computing device 130 may analyze the condition information received from the sensors 120a-120n and may output substantially optimized temperature setpoints 210 of the sensors 120a-120n.

In a second example, the computing device 130 may receive other input 220 from other sources in the data center 100. The other input 220 may include, for instance, the amount of power consumed by the electronic devices 116, the workload placed on the electronic devices 116, etc. In this example, the computing device 130 may employ the other input 220 in determining the setpoints 210 of the sensors 120a-120n.

Figure 2B:
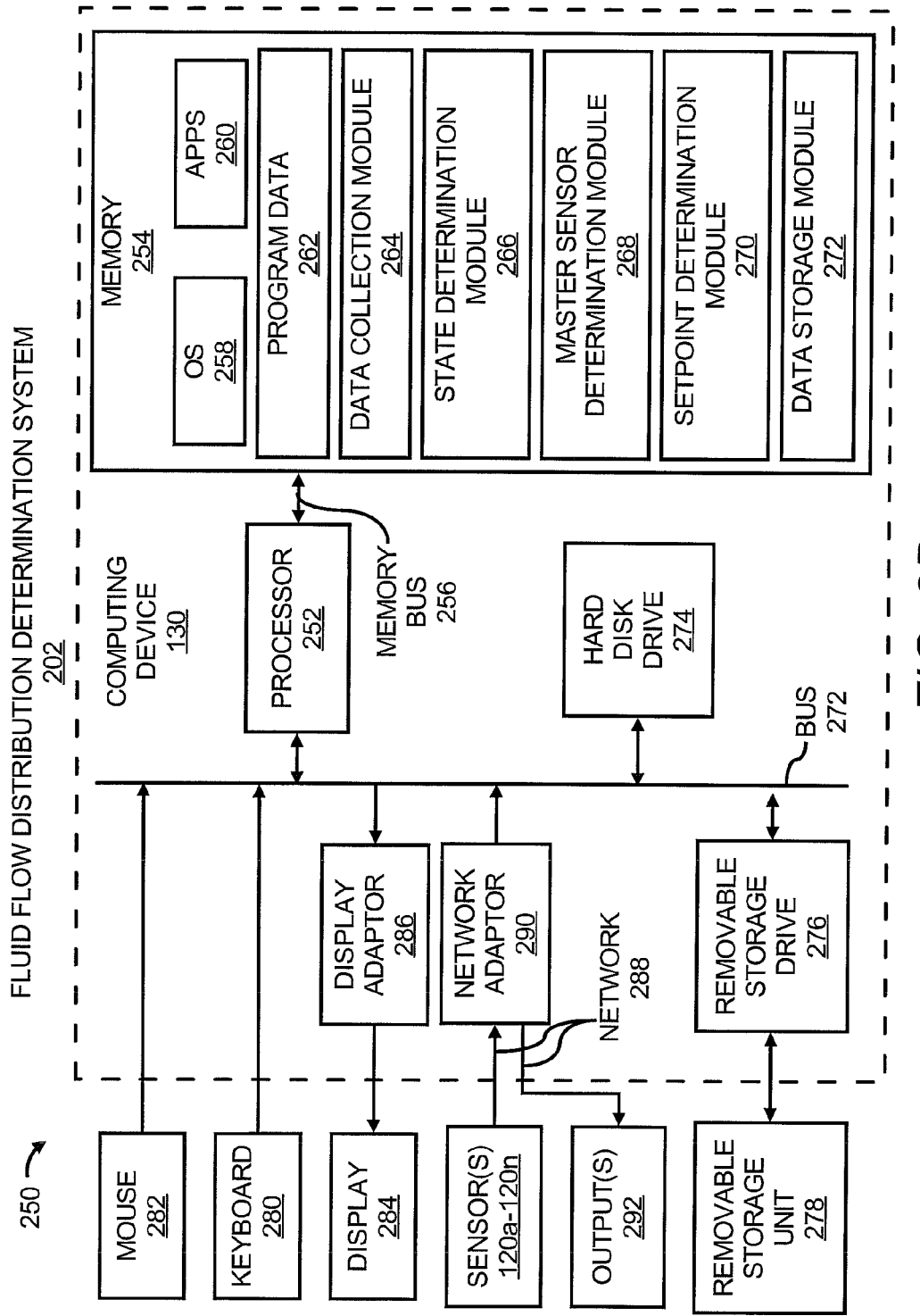
FIG. 2B shows a block diagram of the fluid flow distribution determination system shown in FIG. 2A, including a computing device configured to perform various functions in the system, according to an embodiment of the invention.

With reference now to FIG. 2B, there is shown a block diagram 250 of the fluid flow distribution determination system 202, according to an example. It should be understood that the system 202 may include additional components and that some of the components described herein may be removed and/or modified without departing from the scope of the system 202.

As shown in FIG. 2B, the computing device 130 is depicted as including a processor 252 connected to a memory 254 through a memory bus 256. However, in various instances, the memory 254 may form part of the processor 252. In addition, the processor 252 may be configured to perform various functions in the computing device 130, and may include a microprocessor, a micro-computing device, an application specific integrated circuit (ASIC), and the like, configured to perform various processing functions.

Generally speaking, the memory 254 may be configured to provide storage of software, algorithms, and the like, that provide the functionality of the processor 252. By way of example, the memory 254 may store an operating system (OS) 258, application programs (APPS) 260, program data 262, and the like. The memory 254 may be implemented as a combination of volatile and non-volatile memory, such as DRAM, EEPROM, MRAM, flash memory, and the like. In addition, or alternatively, the memory 254 may comprise a device configured to read from and write to a removable media, such as, a floppy disk, a CD-ROM, a DVD-ROM, or other optical or magnetic media.

The memory 254 is also depicted as including a data collection module 264, a state determination module 266, a control sensor determination module 268, a setpoint determination module 270, and a data storage module 272. The processor 252 may invoke or otherwise implement the modules 264-272 to determine a substantially optimized fluid flow distribution in a structure 100.

The processor 252 may initially invoke or implement the data collection module 264 to collect temperature measurements from the sensors 120a-120n. In addition, the processor 252 may invoke or implement the state determination module 266 to determine the states of either or both of the sensors 120a-120n and the electronic devices 116. The processor 252 may invoke or implement the master sensor determination module 268 to determine which of the sensors 120a-120n have states that are suitable for the sensors 120a-120n to be used as master sensors. The processor may further invoke or implement the setpoint determination module 270 to determine setpoints for the sensors 120a-120n that substantially optimize fluid flow distribution in the structure 100. The processor 252 may further invoke or implement the setpoint determination module 270 to determine whether various other operations may be performed to further optimize the fluid flow distribution.

The processor 252 may implement the data storage module 272 to store the data collected by the data collection module 264. For instance, the data storage module 270 may store the data in a data storage location in the memory 254. In addition, the processor 252 may implement the data storage module 272 to store the states of the sensors 120a-120n and/or the electronic devices 116.

The data storage module 272 may also store the identities and the locations of the sensors 120a-120n. The data storage module 272 may further store associations between the sensors 120a-120n and the electronic devices 116, which may, for instance, be based upon the respective locations of the sensors 120a-120n and the electronic devices 116. This information may manually be stored in the data storage module 272, for instance, during a commissioning process of the structure 100. In addition, the processor 252 may use this information to determine the states of the sensors 120a-120n and/or the electronic devices 116, as described in greater detail herein below.

The data storage module 272 may store the states of the sensors 120a-120n and/or the electronic devices 116, the locations of the sensors 120a-120n, which of the sensors 120a-120n comprise master sensors, the correlations between the sensors 120a-120n and the electronic devices 116, etc., in a variety of different manners. The data storage module 272 may also store the reference temperature setpoints of the sensors 120a-120n, which sensors are considered to be the master sensors, the master reference temperature setpoints, etc., which the processor 252 may update as conditions change in the structure 100. The data storage module 272 may store this information in the form of a look-up table, a map that may be employed to visualize the positions of the sensors 120a-120n, etc.

Instructions from the processor 252 may be transmitted over a communication bus 272 that operates to couple the components of the system 202. The computing device 130 is also depicted as including a secondary memory, which includes a hard disk drive 274 and a removable storage drive 276, representing a floppy diskette drive, a magnetic tape drive, a compact disk drive, etc., which may be employed to communicate information through a removable storage unit 278.

The computing device 130 is also depicted as interfacing with user input and output devices, including a keyboard 280, a mouse 282, and a display 284. A display adaptor 286 may interface with the communication bus 272 and the display 284 and may receive display data from the processor 252 and convert the display data into display commands for the display 284. In addition, the processor 252 may communicate over a network 288, for instance, the Internet, LAN, etc., through a network adaptor 290. As shown, the sensors 120a-120n are configured to transmit collected data over the network 288 to the computing device 130 for storage and processing. The processor 252 may also interface with an output 292, such as, another computing device, the fluid moving devices 114a-114, the ventilation tiles 118, etc., through the network adaptor 290. The network 288 may comprise a wired or a wireless network and the sensors 120a-120n may thus be configured to communicate with the computing device 130 through any reasonably suitable wired or wireless connection.

According to an example where the computing device 130 is configured to control operations of the fluid moving devices 114a-114n, the computing device 130 may transmit instructions over the network 288 to outputs 292 to vary, for instance, operations of the fluid moving devices 114a-114n and/or the fluid delivery devices 118. In this example, the memory 254 may also store a module (not shown) for determining how the outputs 292 are to be manipulated to substantially optimize fluid flow distribution in the structure 100.

Figure 3:
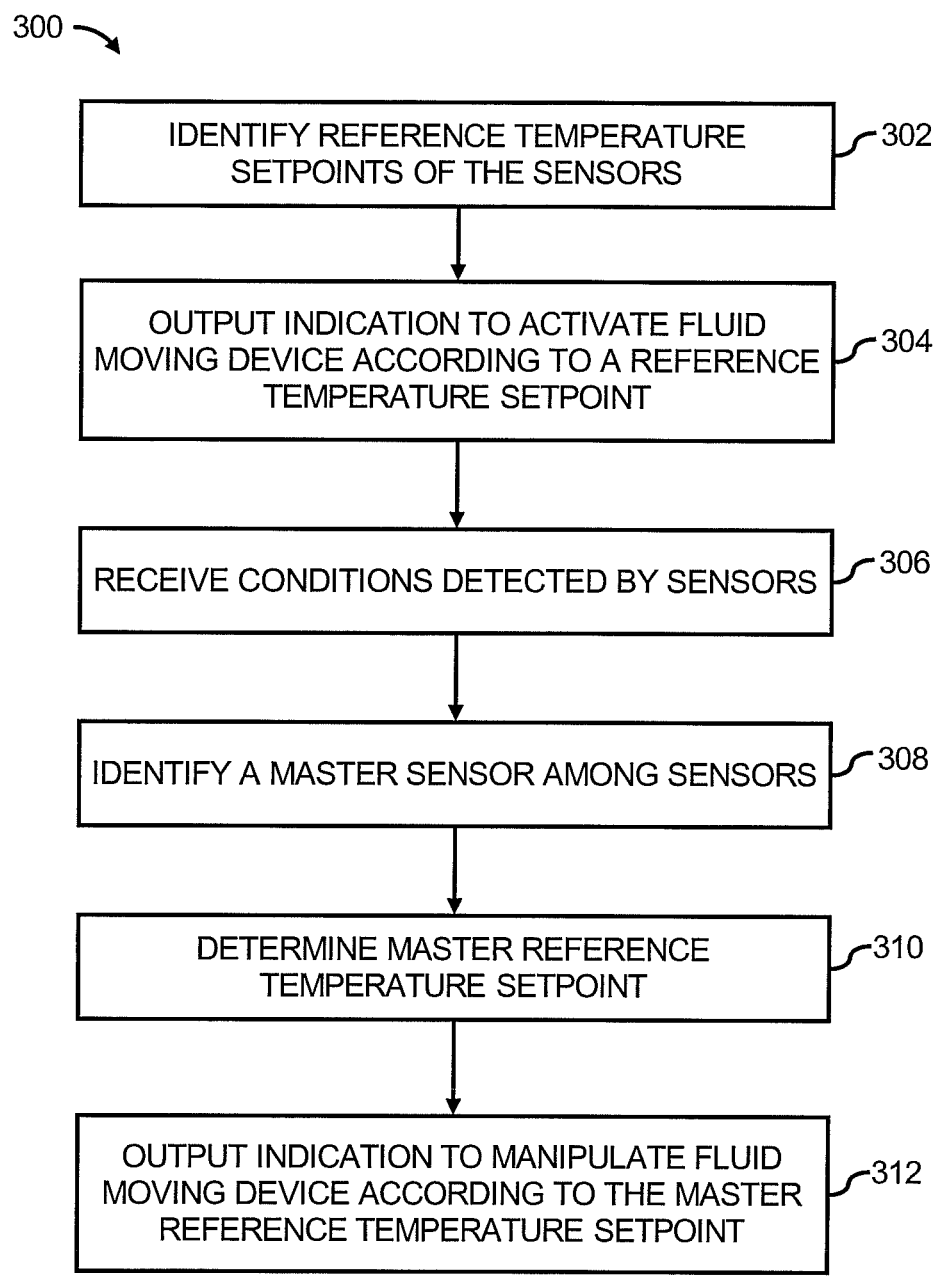
FIG. 3 shows a flow diagram of a method for determining a substantially optimized fluid flow distribution in a structure, according to an embodiment of the invention.

Turning now to FIG. 3, there is shown a flow diagram of a method 300 for determining a substantially optimized fluid flow distribution in a structure, according to an example. It should be apparent to those of ordinary skill in the art that other steps may be added or existing steps may be removed, modified or rearranged without departing from a scope of the method 300.

The description of the method 300 is made with reference to the data flow path 200 depicted in FIG. 2A and the block diagram 250 illustrated in FIG. 2B, and thus makes reference to the elements cited therein. It should, however, be understood that the method 300 is not limited to the elements set forth in the data flow path 200 and the block diagram 250.

At step 302, the processor 252 identifies the reference temperature setpoints of the sensors 120a-120n, which may comprise temperature setpoints derived from inlet temperature specifications of the electronic devices 116 and from a desired operating margin, which may be site specific. The desired operating margin may be selected based upon a variety of factors including, for instance, the level of redundancy of the fluid moving devices 114a-114n, the local and average power densities in the structure 100 (for instance, higher power densities may result in rapid temperature fluctuations from disturbances), operator bias (for instance, some operators may insist on lower temperatures for any of a variety of reasons), etc.

In addition, the reference temperature setpoints may be based, for instance, upon the types of electronic devices 116 around which the sensors 120a-120n are located. By way of example, the reference temperature setpoints may be set at around 25° C. for computer equipment and around 27° C. for network equipment. Moreover, all of the sensors 120a-120n may be set to a homogenous reference temperature setpoint at step 302.

At step 304, the processor 252 outputs an indication to activate one or more fluid moving devices 114a-114n according to the reference temperature setpoints of the plurality of sensors 120a-120n. In instances where the processor 252 is configured to control the fluid moving devices 114a-114n, the indication to activate one or more of the fluid moving devices 114a-114n may comprise a control signal communicated to the one or more fluid moving devices 114a-114n to become activated. In other instances, the indication to activate one or more of the fluid moving devices 114a-114n may comprise a visible indication displayed on the display 284, an audible indication, or other type of indication communicated to an output 292. In these instances, the one or more fluid moving devices 114a-114n may manually be activated in response to the indication outputted by the processor 252.

At step 306, the processor 252 receives conditions detected by the sensors 120a-120n. The processor 252 may wait for a period of time following the performance of step 304 to enable conditions within the structure 100 to substantially stabilize prior to implementing step 306.

At step 308, the processor 252 identifies at least one master sensor among the sensors 120a-120n. The at least one master sensor may comprise a sensor 120a that is particularly susceptible to thermal phenomena associated with, for instance, rack configuration density, sensor location, etc. Generally speaking, the processor 252 is configured to identify sensors 120a-120n that are in "problem" areas, such as, local hot spots, areas of re-circulated fluid flow, etc., and to select those sensors 120a-120n as the master sensors for the fluid moving devices 114a-114n. The processor 252 may fix the problems by, for instance, increasing airflow to a certain rack.

In addition, the processor 252 identifies a master sensor for each of the fluid moving devices 114a-114n based upon, for instance, the states of the sensors 120a-120n, which may be determined by the state determination module 266. More particularly, for instance, the processor 252 may compare the conditions, such as, temperatures, received at step 306 with at least one preset condition. In addition, the processor 252 may determine the respective states of one or more sensors 120a-120n based upon the comparison. Various manners in which the processor 252 may determine the states and the master sensors are discussed in greater detail herein below with respect to FIGS. 4A-4C.

At step 310, the processor 252 determines a master reference temperature setpoint for each of the master sensors identified at step 308. As described in greater detail herein below, the processor 262 determines a master reference temperature setpoint for each of the master sensors that substantially optimizes fluid flow distribution in the structure 100.

At step 312, the processor 252 outputs an indication to manipulate one or more fluid moving devices 114a-114n according to the master reference temperature setpoint determined at step 310. In other words, the processor 252 may output an indication to vary a characteristic of fluid flow supplied by one or more of the fluid moving devices 114a-114n to substantially cause the temperature at the master sensor to substantially reach the reference temperature setpoint. In addition, or alternatively, the processor 252 may adjust the operation of one or more of the fluid moving devices 114a-114n such that the master sensors are at or below the homogeneous reference temperature setpoint identified at step 302. As discussed above, the indication output by the processor 252 may comprise a signal to control one or more of the fluid moving devices 114a-114n and the fluid delivery devices 118 or an instruction that a user may perceive and act upon.

Figure 4A:
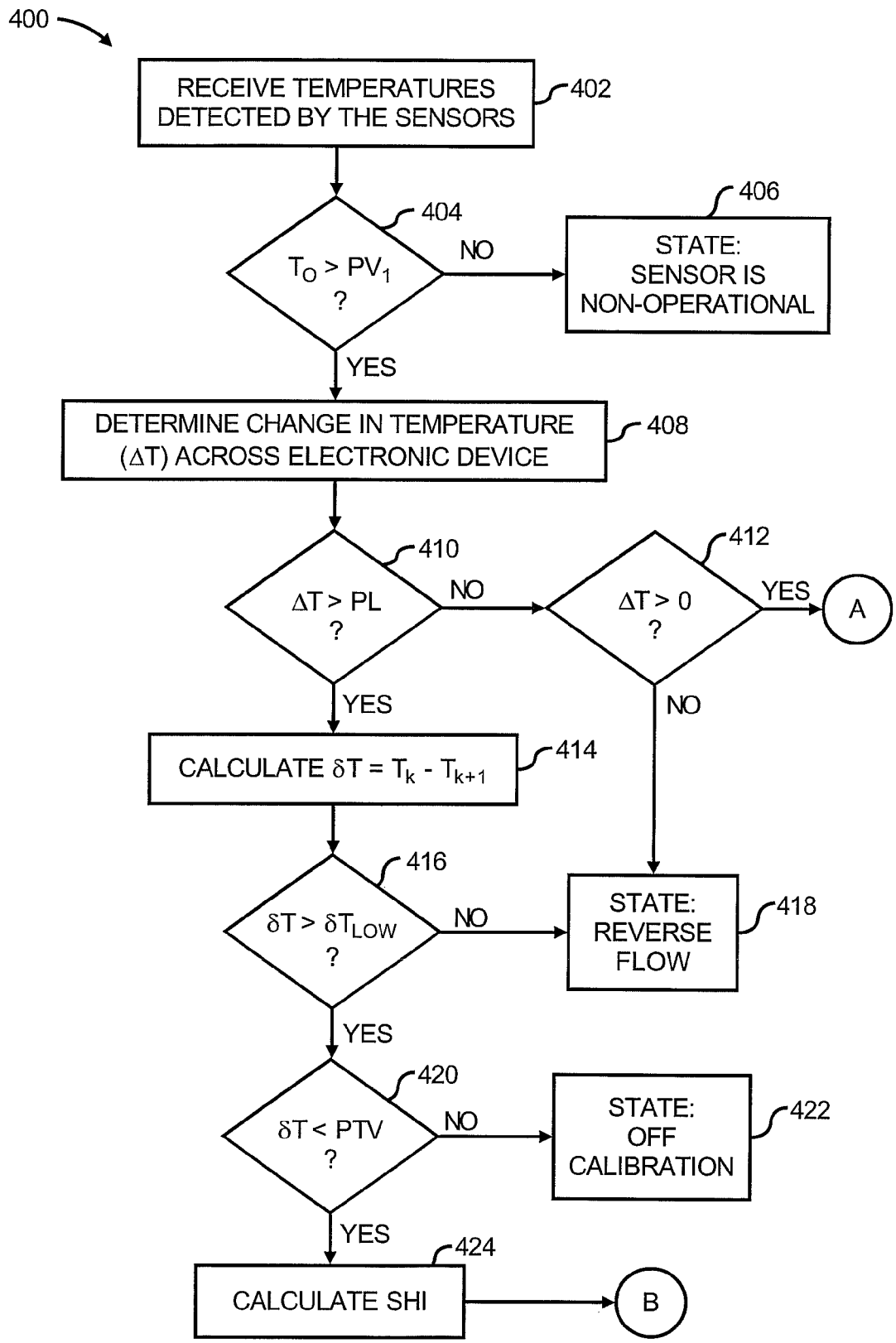
FIGS. 4A-4C, collectively, show a flow diagram of a method of determining a state of an apparatus to, for instance, identify master sensors as depicted in FIG. 3, according to an embodiment of the invention.
Figure 4B:
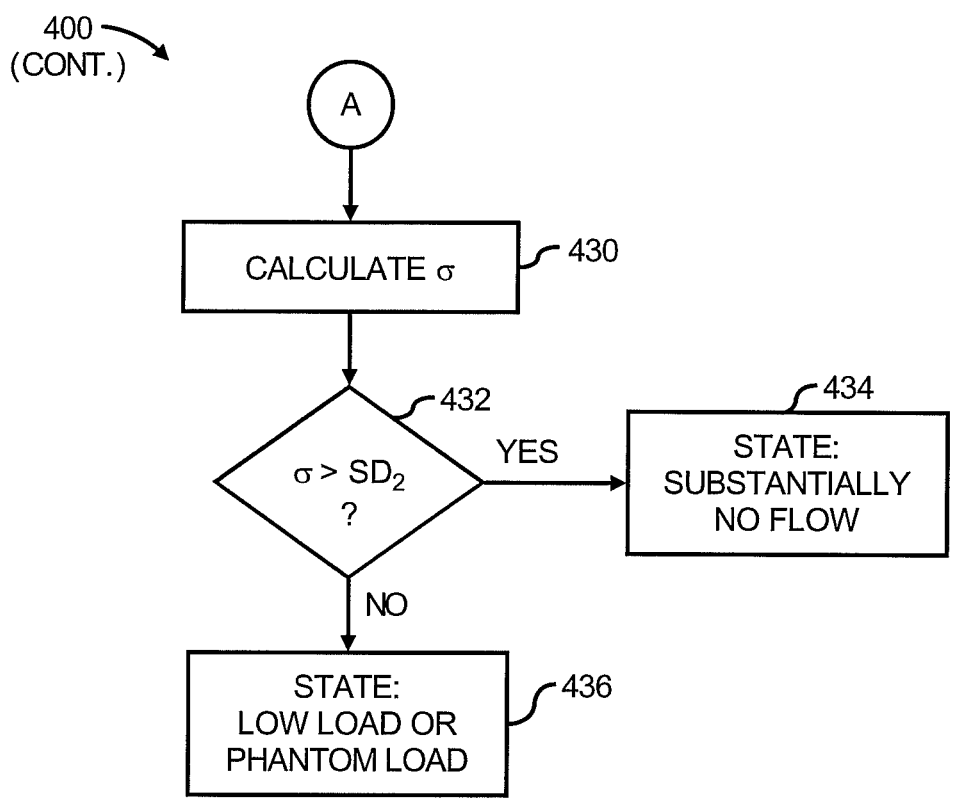
Figure 4C:
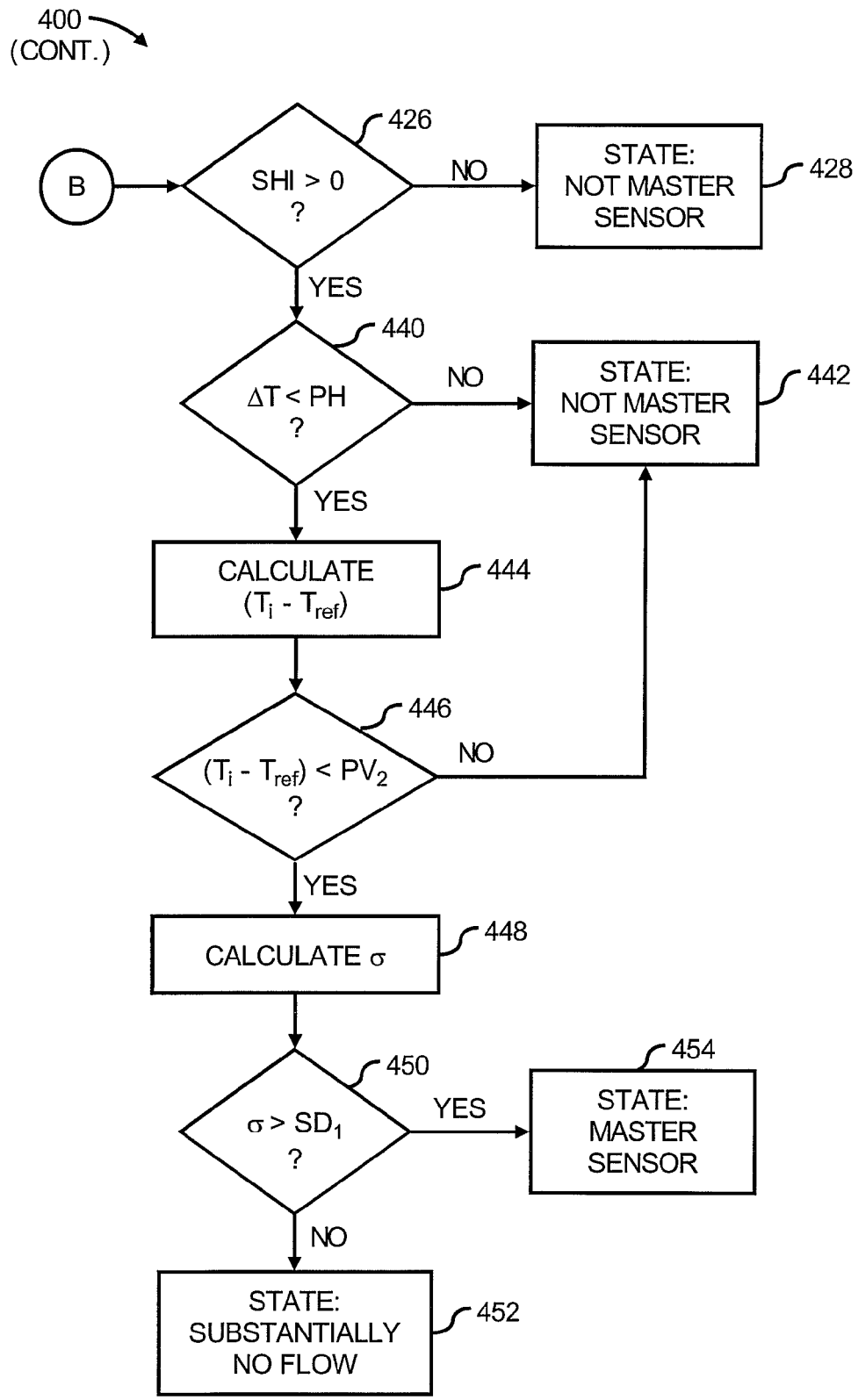

Turning now to FIGS. 4A-4C, there is shown, collectively, a flow diagram of a method 400 of determining a state of an apparatus to, for instance, identify master sensors at step 310 (FIG. 3), according to another example. It should be apparent to those of ordinary skill in the art that other steps may be added or existing steps may be removed, modified or rearranged without departing from a scope of the method 400.

Generally speaking, the sensors 120a-120n may be in one of a plurality of different states, which include, for instance, that the sensors 120a-120n are not operational, that the sensors 120a-120n are off calibration, that the sensors 120a-120n are detecting re-circulated fluid conditions, that the sensors 120a-120n are suitable for use as master sensors, that the sensors 120a-120n are not suitable for use as master sensors, etc. As further described in U.S. patent application Ser. No. 11/644,158, entitled "Apparatus State Determination Method and System", filed on Dec. 22, 2006, the states of electronic devices 116 may also be determined.

Although reference is made to a single outlet sensor $120a\_o$, a single inlet sensor $120\_i$ associated with the outlet sensor $120a\_o$, and an electronic device 116 positioned in the fluid flow path of these sensors $120a\_o$ and $120a\_i$, it should readily be understood that the principles discussed herein to those apparatuses are applicable to the remaining sensors 120b-120n and electronic devices 116.

In the method 400, the processor 252 may receive and store temperatures detected by a plurality of sensors 120a-120n, as indicated at step 402. The processor 252 may further store correlations between the identities of the sensors 120a-120n and the detected temperatures received from the sensors 120a-120n. In one respect, therefore, the processor 252 may determine correlations between the temperature measurements from the outlet sensors and their associated inlet sensors. In addition, the processor 252 may determine associations between the electronic devices 116 and the correlated inlet and outlet sensors.

At step 404, for at least one of the outlet sensors $120a\_o$-$120n\_o$, the processor 252 may compare the detected temperature $(T_o)$ of the outlet sensor $120a\_o$ with a first predetermined value $(PV_1)$, which may comprise any reasonably suitable value that indicates whether the outlet sensor $120a\_o$ is operational. By way of example, the first predetermined value $(PV_1)$ may comprise a null value. Thus, for instance, if the detected temperature $(T_o)$ of the outlet sensor $120a\_o$ is equal to or less than the null value, the processor 252 may determine that the outlet sensor $120a\_o$ is non-operational, as indicated at step 406.

If, however, the detected temperature $(T_o)$ of the outlet sensor $120a\_o$ exceeds the first predetermined value $(PV_1)$, the processor 252 may determine that the outlet sensor 120a_o is operational. In addition, at step 408, the processor 252 may determine a change in temperature (ΔT) across an electronic device 116. More particularly, the processor 252 may determine the difference in temperatures detected by the outlet sensor 120a_o ($T_o$) and an associated inlet sensor 120a_i ($T_i$). An inlet sensor 120a_i may be considered as being associated with an outlet sensor 120a_o if they are in the fluid flow path across the same electronic device 116 or across the same location in a rack 102a. Thus, for instance, the outlet sensor 120a_o may be configured to detect the temperature of fluid flow exhausted from the electronic device 116 and the associated inlet sensor 120a_i may be configured to detect the temperature of fluid flow entering into the electronic device 116.

At step 410, the processor 252 may compare the change in temperature (ΔT) with a predetermined low temperature value (PL). The predetermined low temperature value (PL) may be based upon the range of temperature differences found among the outlet sensors 120a_o-120n_o and their associated inlet sensors 120a_i-120n_i. The predetermined low temperature value (PL) may thus comprise the lowest temperature difference within the range of temperature differences, or a temperature difference within a predetermined level from the lowest temperature difference. By way of example, the predetermined low temperature value (PL) may be equal to 2° C.

If the change in temperature (ΔT) falls below the predetermined low temperature value (PL) at step 410, the processor 252 may determine whether the change in temperature (ΔT) exceeds a null value, as indicated at step 412. If the change in temperature (ΔT) exceeds the null value, the processor 252 may calculate a standard deviation (σ) of the temperatures detected by a plurality of outlet sensors 120a_o-120n_o positioned at different heights with respect to each other, as indicated at step 430 (FIG. 4B). The plurality of outlet sensors 120a_o-120n_o may, for instance, comprise those outlet sensors 120a_o-120n_o positioned on a single rack 102a.

At step 432, the processor 252 may compare the calculated standard deviation (σ) with a second predetermined standard deviation (SD$_2$). The second predetermined standard deviation (SD$_2$) may be based set according to the level of uncertainties in the measurements and analysis of the measurements obtained by the sensors 120a-120n, the inaccuracies of the sensors 120a-120n, variations in sensor 120a-120n positions, etc. By way of example, the second predetermined standard deviation (SD$_2$) may be equal to 0.5. The second predetermined standard deviation (SD2) may indicate a reverse gradient, for instance, if the temperatures are decreasing as the height is increased for a rack 102a. This occurs because, typically, for racks 102a-102n that receive cooling fluid from a raised floor, the lowest sensor 120m_i should have the lowest temperature and the highest sensor 120n_i should have the highest temperature.

If the calculated standard deviation (σ) exceeds the second predetermined standard deviation (SD$_2$), the processor 252 may determine that the electronic device 116 is in a state where there is substantially no fluid flow through the electronic device 116, as indicated at step 434. The determination at step 434 may be an indication that the electronic device 116 is in a deactivated state, is otherwise not in an operating condition, or that an electronic device 116 is absent from that location in a rack 102a. If, however, the calculated standard deviation (σ) falls below the second predetermined standard deviation (SD$_2$), the processor 252 may determine that the electronic device 116 is in a state where the electronic device 116 contains a relatively low load or a phantom load, as indicated at step 436. The phantom load may include, for instance, a perceived load on the electronic device 116, which may be caused by recirculation of heated fluid through the electronic device 116.

With reference back to step 410, if the change in temperature (ΔT) exceeds the predetermined low temperature value (PL), the processor 252 may calculate the difference in temperature (δT) between the associated inlet sensor 120a_i ($T_k$) and an inlet sensor 120b_i ($T_{k+1}$) located at a higher level than the associated inlet sensor 120a_i, as indicated at step 414. In addition, at step 416, the processor 252 may compare the difference in temperature (δT) with a predetermined low temperature difference (δT$_{low}$). The predetermined low temperature difference (δT$_{low}$) may be set based upon a number of various factors. These factors may include, for instance, the accuracy of the sensors 120a-120n, the rates at which fluid flow is supplied from the vent tiles 118, etc. By way of example, if the sensors 120a-120n have a 0.5 degree of accuracy, the predetermined low temperature difference (δT$_{low}$) may be equal to 1 degree Celsius, to thereby provide a sufficient margin outside of the noise region of the sensors 120a-120n.

If the difference in temperature (δT) falls below the predetermined low temperature difference (δT$_{low}$), or if, at step 412, the change in temperature (ΔT) falls below the null value, the processor 252 may determine that the state of the sensor 120a is that the sensor 120a is operating in a reverse fluid flow, as indicated at step 418.

If, however, the difference in temperature (δT) exceeds the predetermined low temperature difference (δT$_{low}$), the processor 252 may determine whether the difference in temperature (δT) falls below a predetermined temperature variance (PTV), as indicated at step 420. The predetermined temperature variance (PTV) may be set according to a number of factors, including, desired tolerance levels, the accuracies of the sensors 120a-120n, etc. By way of example, the predetermined temperature variance (PTV) may be set according to a variance values that exceed commonly detected temperature differences. Thus, for instance, the predetermined temperature variance (PTV) may be equal to around 4 degrees C., in one example.

If the difference in temperature (δT) exceeds the predetermined temperature variance (PTV), the processor 252 may determine that the state of the associated inlet sensor 120a_i is off calibration, as indicated at step 422. In other words, for instance, the processor 252 may determine that the associated inlet sensor 120a_i may not have been properly calibrated and may thus remove that sensor 120a_i from a pool of potential master sensors for a fluid moving device 114a.

If, however, the difference in temperature (δT) falls below the predetermined temperature variance (PTV), the processor 252 may calculate a supply heat index (SHI) in the vicinity of the outlet sensor 120a_o and the associated inlet sensor 120a_i, as indicated at step 424. The processor 252 may calculate the supply heat index (SHI) through the following equation:

$$SHI = \frac{T_i - T_{ref}}{T_o - T_{ref}}. \quad \text{Equation (1)}$$

In Equation (1), $T_i$ represents the temperature detected by the inlet sensor 120a_i, $T_o$ represents the temperature detected by the outlet sensor 120a_o, and $T_{ref}$ represents the temperature of fluid flow supplied to the inlet sensor 120a_i. A more detailed description of SHI is provided in commonly assigned U.S. Pat. No. 7,051,946, entitled "Air Recirculation Index", the disclosure of which is hereby incorporated by reference in its entirety. As discussed in that patent, SHI is a scalable index of performance that may quantify the amount of re-circulation occurring at various locations.

Figure 5:
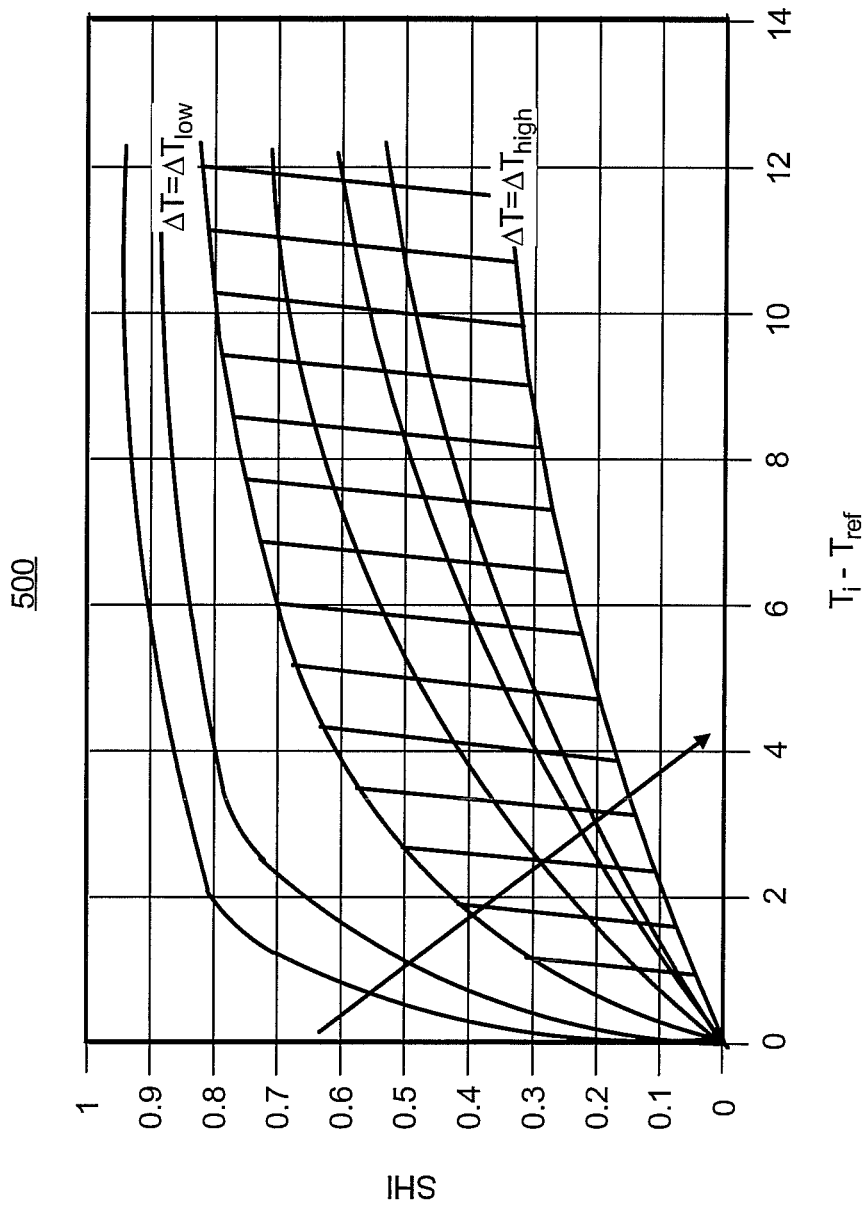
FIG. 5 depicts a graph showing an example of a relationship between a supply heat index (SHI) and a difference between the inlet temperature and a reference temperature over a normal operating range of sensors between a low temperature ($\Delta T_{low}$) and a high temperature ($\Delta T_{high}$), according to an embodiment of the invention.

In addition, FIG. 5 depicts a graph 500 depicting an example of a relationship between a supply heat index (SHI) and a difference between the inlet temperature and a reference temperature over a normal operating range of sensors between a low temperature ($\Delta T_{low}$) and a high temperature ($\Delta T_{high}$). As shown in the graph 500 of FIG. 5, the X-axis depicts "$T_i$-$T_{ref}$" 502 and the Y-axis comprises SHI 504. If the SHI lies within a bounded region as shown by the hashed section in FIG. 5, the states of the sensor 120a-120n and the electronic devices 116 are considered to be relatively normal.

At step 426 (FIG. 4C), the processor 252 may determine whether the SHI exceeds a null value. If the SHI falls below the null value, the processor 252 may determine that the associated inlet sensor 120a_i is not suitable for use as a master sensor, as indicated at step 428. In other words, when the SHI is negative, there is a relatively high probability that the sensor 120a_i hardware is faulty, and thus, the measurements obtained by the sensor 120a_i are inaccurate.

If, however, at step 426, the processor 252 determines that the SHI is greater than the null value, the processor may compare the change in temperature ($\Delta T$) calculated at step 408 with a predetermined high temperature value (PH), as indicated at step 440. The predetermined high temperature value (PH) may be based upon the range of temperature differences found among the outlet sensors 120a_o-120n_o and their associated inlet sensors 120a_i-120n_i. The predetermined high temperature value (PH) may thus comprise the highest temperature difference within the range of temperature differences, or a temperature difference within a predetermined level from the highest temperature difference. By way of example, the predetermined high temperature value (PH) may be equal to 20 degrees Celsius.

If the processor 252 determines that the change in temperature ($\Delta T$) exceeds the predetermined high temperature value (PH), the processor 252 may determine that the associated inlet sensor 120a_i is not suitable for use as a control sensor, as indicated at step 442. If, however, the processor 252 determines that the change in temperature ($\Delta T$) exceeds the predetermined high temperature value (PH), the processor 252 may calculate a difference between the temperature ($T_i$-$T_{ref}$) detected by the associated inlet sensor 120a_i and the reference temperature used to calculate SHI, as indicated at step 444.

At step 446, the processor 252 may compare the difference in temperature ($T_i$-$T_{ref}$) with a second predetermined value ($PV_2$). The second predetermined value ($PV_2$) may be based upon specified temperature changes across electronic devices 116, which may be set by the electronic device 116 manufacturers. By way of example, the second predetermined value ($PV_2$) may be set to equal 12 degrees Celsius.

If the processor 252 determines that the difference in temperature ($T_i$-$T_{ref}$) exceeds the second predetermined value ($PV_2$), the processor 252 may determine that the associated inlet sensor 120a i is not suitable for use as a master sensor, as indicated at step 442. If, however, the processor 252 determines that the difference in temperature ($T_i$-$T_{ref}$) falls below the second predetermined value ($PV_2$), the processor 252 may calculate a standard deviation ($\sigma$) of the temperatures detected by a plurality of outlet sensors 120a_o-120n_o positioned at different heights with respect to each other, as indicated at step 448. The plurality of outlet sensors 120a_o-120n_o may, for instance, comprise those outlet sensors 120a_o-120n_o positioned on one or more racks 102a-102n.

At step 450, the processor 252 may compare the calculated standard deviation ($\sigma$) with a first predetermined standard deviation ($SD_1$). The first predetermined standard deviation ($SD_1$) may be based set according to the level of uncertainties in the measurements and analysis of the measurements obtained by the sensors 120a-120n, the inaccuracies of the sensors 120a-120n, variations in sensor 120a-120n positions, etc. By way of example, the second predetermined standard deviation ($SD_2$) may be equal to 0.3. If the calculated standard deviation ($\sigma$) falls below the first predetermined standard deviation ($SD_1$), the processor 252 may determine that the electronic device 116 is in a state where there is substantially no fluid flow through the electronic device 116, as indicated at step 452. If, however, the calculated standard deviation ($\sigma$) exceeds the first predetermined standard deviation ($SD_1$), the processor 252 may determine that the inlet sensor 120a_i is suitable for use as a master sensor, as indicated at step 454.

The processor 252 may implement the method 400 to determine the states of each of the sensors 120a-120n contained in the structure. In addition, the processor 252 may remove those sensors 120a-120n that have not been identified as being candidates for master sensors from the control pools of the fluid moving devices 114a-114n. For those sensors 120a-120n identified as having the master sensor state, the processor 252 may determine correlations between the master sensors and the fluid moving devices 114a-114n. The correlations may be implemented in determining how the fluid moving devices 114a-114n are to be manipulated based upon the temperatures detected by the master sensors.

In one example, a master sensor may be correlated to a fluid moving device 114a if the master sensor is within a zone of influence for (and a control family of) the fluid moving device 114a. The zone of influence for the fluid moving device 114a may be defined as an area in the structure 100 over which the fluid moving device 114a has at least a particular level of influence. By way of example, the zone of influence for the fluid moving device 114a may be defined as the areas in the structure 100 whose temperature changes to at least a predetermined level when the temperature of the fluid flow supplied by the fluid moving device 114a changes.

The zones of influence for the fluid moving devices 114a-114n are described in greater detail, for instance, in U.S. patent application Ser. No. 10/078,087, entitled "Commissioning of Sensors". In addition, or alternatively, the processor 252 may identify the master sensors through various thermal zone mapping techniques discussed in U.S. patent application Ser. No. 11/699,402, entitled "Computerized Tool for Assessing Conditions in a Room".

Figure 6:
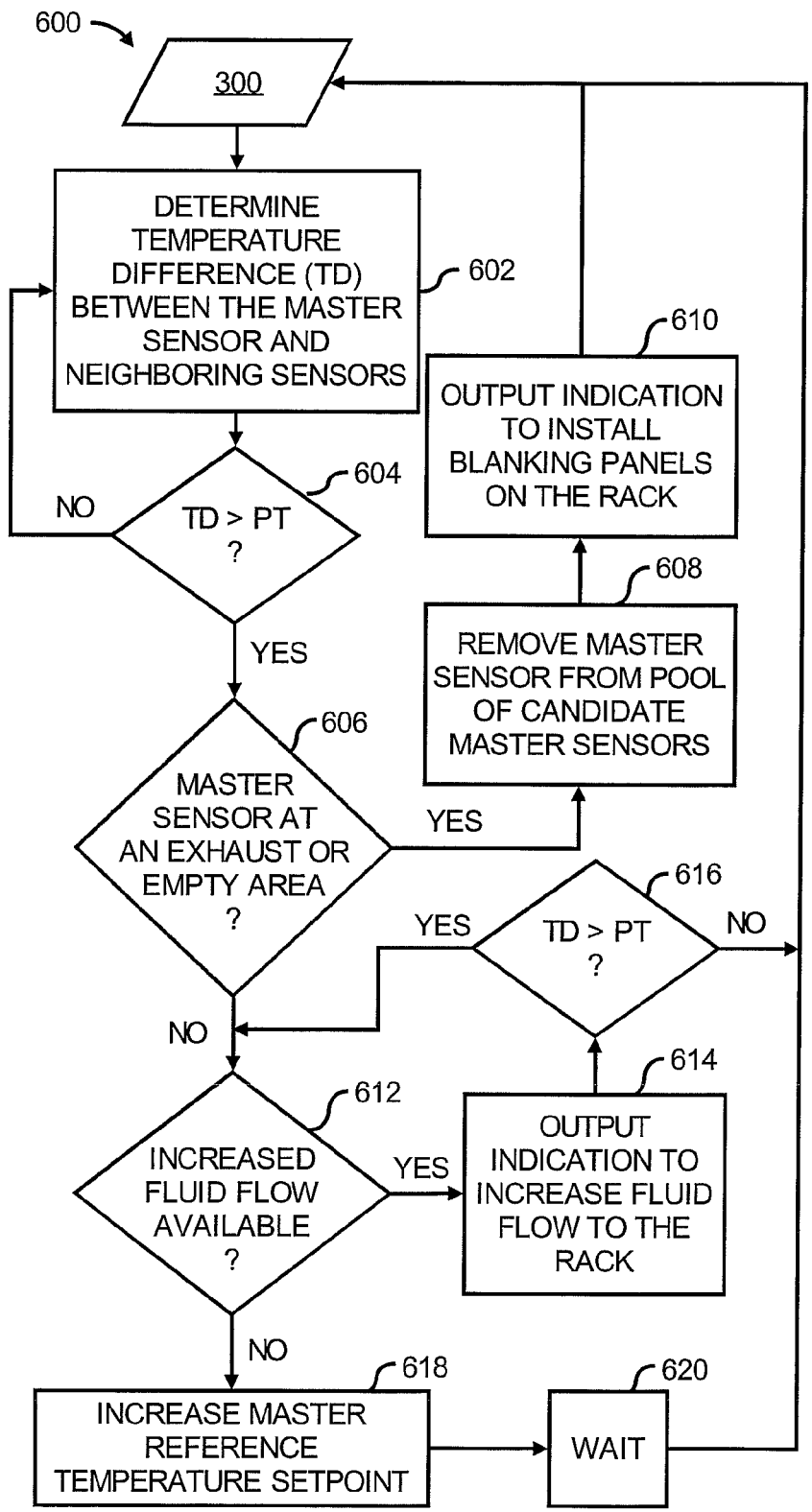
FIG. 6 shows a flow diagram of a method for substantially optimizing fluid flow distribution in a structure configured to be cooled by at least one fluid moving device, according to an embodiment of the invention.

Turning now to FIG. 6, there is shown a flow diagram of a method 600 for substantially optimizing fluid flow distribution in a structure configured to be cooled by at least one fluid moving device 114a, according to an example. It should be apparent to those of ordinary skill in the art that other steps may be added or existing steps may be removed, modified or rearranged without departing from a scope of the method 600.

As shown, the method 600 may be implemented following performance of the method 300, for instance, to further refine conditions to substantially optimize fluid flow distribution in the structure 100.

After the master sensor for a fluid moving device 114a has been determined through implementation of the method 300, the processor 252 may determine temperature differences (TD) between the master sensor and the sensors neighboring the master sensor, as indicated at step 602. The neighboring sensors may comprise those sensors in the same rack or in racks neighboring the rack in which the master sensor is located.

At step 604, the processor 252 determines whether any of the temperature differences (TD) exceeds a predetermined threshold (PT). The predetermined threshold may be based upon a variety of factors, such as, the desired operating margin discussed above. By way of particular example, the predetermined threshold may be 2° C.

If the temperature differences fall below the predetermined threshold at step 604, the processor 252 may continue to receive conditions detected by the sensors 120a-120n and may continue to perform steps 602 and 604 until the processor 252 determines that at least one temperature difference exceeds the predetermined threshold. At which time, at step 606, the processor 252 may determine whether the master sensor determined at step 310 is in an exhaust of an electronic device 116 or in a non-operating section of a rack 102a. The non-operating section of the rack 102a may comprise a section of the rack 102a that does not contain an electronic device 116, contains a malfunctioning electronic device 116, or contains a deactivated electronic device 116. The processor 252 may make this determination from input received from a user or through previously stored data pertaining to the location of the master sensor.

If the processor 252 determines that the master sensor is at an exhaust or in a non-operating section of a rack 102a, the processor 252 may remove that master sensor from a pool of candidate master sensors, as indicated at step 608. At step 610, the processor 252 may also output an indication that blanking panels should be installed on the rack 102a to substantially reduce fluid flow through the rack 102a. In addition, the processor 252 may repeat the method 300 to identify a different master sensor and master reference temperature setpoint.

If the processor 252 determines that the master sensor is not at an exhaust or a non-operating section of the rack 102a, the processor 252 may determine whether increased fluid flow supplied to the rack 102a is available at step 612. The determination as to whether additional fluid flow is available may depend upon the current setting of a fluid delivery device 118 arranged to deliver cooling fluid flow to the rack 102a. That is, the processor 252 may have access to data indicating whether the fluid delivery device 118 is currently supplying fluid flow at a maximum rate. If the processor 252 determines that increased fluid flow is available, the processor 252 may output an indication to increase fluid flow to the rack 102a, as indicated at step 614. The fluid flow may be increased by increasing the opening in the fluid delivery device 118, either manually or via a control signal sent by the processor 252. In addition, or alternatively, the fluid flow may be increased by increasing a flow rate of fluid flow supplied by one or more fluid moving devices 114a-114n, either manually or via a control signal sent by the processor 252.

In addition, after waiting for a period of time to allow for conditions around the master sensor to substantially stabilize, the processor 252 may again determine whether the temperature difference (TD) between the master sensor and the neighboring sensors exceed the predetermined threshold (PT) at step 616. If the TD exceeds the PT, the processor 252 may repeat step 612, and if there is additional fluid flow available, step 614 also. According to an example, the opening in the fluid delivery device 118 may be increased by about 10% during each iteration of steps 612-616. Once the temperature difference is determined to fall below the predetermined threshold at step 616, the processor 252 may repeat the steps in methods 300 and 600.

If, however, the processor 252 determines that increased fluid flow is unavailable at step 612, the processor 252 may increase the master reference temperature setpoint, as indicated at step 618, which may substantially be capped to a maximum threshold. By way of particular example, the master reference temperature setpoint may be increased by 1-3° C. up to a maximum threshold between about 28-30° C. for computer servers and higher temperatures for networking equipment.

Following step 618, the processor 252 may wait at step 620 for a predetermined period of time that has been found to be sufficient to allow for conditions in the structure 100 to substantially stabilize. Following step 620, the processor 252 may implement again implement the method 300, which may also include implementation of the method 600. In addition, the processor 252 may repeat the methods 300 and 600 until no new master sensors require adjustment, after a predetermined amount of time has elapsed, until manually ended, etc.

In addition to the methods 300 and 600, the fluid flow distribution may be further substantially optimized by determining whether racks near the master sensors are exhausting into a cold aisle, for instance, an aisle containing a ventilation tile 118, and blocking or redirecting the exhaust flow. In addition, or alternatively, the master reference temperature setpoint may be increased beyond the maximum threshold in extreme cases, depending upon the placement of the master sensor, and only if the hot fluid flow impacting the master sensor is localized to the master sensor and does not impact nearby equipment.

Some or all of the operations set forth in the methods 300, 400, and 600 may be contained as one or more utilities, programs, or subprograms, in any desired computer accessible or readable medium. In addition, the methods 300, 400, and 600 may be embodied by a computer program, which may exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for determining a fluid flow distribution in a structure to be cooled by a fluid moving device, said method comprising:

outputting an indication to activate the fluid moving device according to a reference temperature setpoint of a plurality of sensors in the structure;

receiving, by a processor, conditions detected in multiple areas of the structure with the plurality of sensors;

identifying, by the processor, a master sensor among the plurality of sensors based upon the detected conditions; and determining, by a processor, a master reference temperature setpoint for the master sensor that substantially optimizes fluid flow distribution in the structure based upon the conditions detected by the plurality of sensors in response to changes in a characteristic of fluid flow supplied to the plurality of sensors.

2. The method according to claim 1, wherein the fluid flow distribution is substantially optimized when sufficient cooling resources are supplied to multiple locations of the structure while substantially minimizing energy consumption levels in operating the fluid moving device, said method further comprising:

identifying which sensors of the plurality of sensors are within a control family of the fluid moving device, wherein the identified sensors are affected to at least a predefined level by the changes in the characteristic of fluid flow, and wherein identifying the master sensor further comprises identifying a master sensor for the fluid moving device from the sensors within the control family.

3. The method according to claim 1, wherein the structure comprises a data center housing a rack, the method further comprising:

setting the plurality of sensors to a homogeneous reference setpoint temperature prior to activating the fluid moving device;

identifying whether the master sensor is in at least one of a reverse fluid flow location and a non-operating section of the rack;

at least one of removing the master sensor from a control pool of the fluid moving device and increasing the reference temperature setpoint of the plurality of sensors in response to the master sensor being identified as being in at least one of a reverse fluid flow location and a non-operating section of the rack; and identifying a new master sensor in response to the master sensor being removed from the control pool.

4. The method according to claim 1, further comprising:

setting the plurality of sensors to a homogeneous reference setpoint temperature prior to activating the fluid moving device, and wherein identifying the master sensor further comprises identifying the master sensor based upon the plurality of sensors being set to the homogeneous reference setpoint temperature; and adjusting a characteristic of the fluid flow supplied by the fluid moving device to cause the master sensor to have a temperature that is one of at or below the homogeneous reference setpoint temperature.

5. The method according to claim 1, wherein the structure comprises a data center housing a rack, the method further comprising:

setting the plurality of sensors to a homogeneous reference setpoint temperature prior to outputting the indication to activate the fluid moving device, and wherein identifying the master sensor further comprises identifying the master sensor based upon the plurality of sensors being set to the homogeneous reference setpoint temperature;

determining differences in temperature between temperature values detected by the master sensor and temperature values detected by sensors of the plurality of sensors in a neighboring vicinity of the master sensor; and in response to a determination that at least one of the determined differences in temperature is greater than a predetermined temperature difference, determining whether the master sensor is at least one of located at an exhaust of the rack and in a non-operating section of the rack and removing the master sensor from a control pool of the fluid moving device in response to the master sensor being at least one located at an exhaust of the rack and in a non-operating section of the rack.

6. The method according to claim 5, further comprising:

outputting an indication that blanking panels are to be installed on the rack in response to the master sensor being at least one located at an exhaust of the rack and in a non-operating section of the rack.

7. The method according to claim 5, further comprising:

outputting an indication that the fluid delivery device is to increase fluid flow delivered through the fluid delivery device in response to the master sensor being at least one of located at an exhaust of the rack and in a non-operating section of the rack;

determining the differences in temperature detected by the master sensor and the temperatures detected by the sensors in the neighboring vicinity of the master sensor in response to outputting the indication to increase fluid flow delivered through the fluid delivery device; and outputting an indication that the fluid delivery device is to further increase the fluid flow delivered through the fluid delivery device in response to a determination that the differences in temperature are greater than a predetermined temperature difference.

8. The method according to claim 7, further comprising:

determining whether the fluid flow through the fluid delivery device is at a maximum output level of the fluid delivery device in response to the master sensor being at least one located at an exhaust of the rack and in a non-operating section of the rack; and outputting an indication to increase the master reference temperature setpoint for the master sensor by a predetermined amount up to a predefined maximum threshold in response to a determination that the fluid delivery device is delivering fluid at the maximum output level.

9. A system for determining a substantially optimized fluid flow distribution in a structure, said system comprising:

a fluid moving device to supply cooling fluid flow to a plurality of locations in the structure through a fluid delivery device;

a plurality of sensors to detect environmental conditions in multiple locations of the structure; and a controller to receive the detected environmental conditions in the multiple locations and to identify a master sensor among the plurality of sensors from the detected environmental conditions, wherein the controller is further to determine and store a reference setpoint temperature for the master sensor that substantially optimizes fluid flow distribution in the structure based upon conditions detected by the plurality of sensors in response to changes in a characteristic of fluid supplied to the plurality of sensors.

10. The system according to claim 9, wherein the fluid flow distribution is substantially optimized when at least one of the fluid moving device and the fluid delivery device is adjusted to supply sufficient cooling resources to the multiple locations of the structure while substantially minimizing energy consumption levels in operating the fluid moving device.

11. The system according to claim 9, said system comprising:
- a plurality of fluid moving devices;
- wherein the controller is further to identify which of the plurality of sensors are within a respective control family of the fluid moving devices, wherein the identified sensors in each of the control families comprise those sensors that are affected to at least a predefined level by changes in the characteristic of fluid flow, and wherein for each respective control family, the controller is further to identify a master sensor for each of the fluid moving devices from the identified sensors contained in the respective control families.

12. The system according to claim 9, wherein the controller is further to set the plurality of sensors to a homogeneous reference temperature setpoint and wherein the controller is further to identify the master sensor based upon the plurality of sensors set at the homogeneous reference temperature setpoint.

13. The system according to claim 12, wherein the structure comprises a data center housing a rack, wherein the controller is to identify whether the master sensor is in at least one of a reverse fluid flow location and a non-operating section of the rack, and wherein the controller is further to at least one of remove the master sensor from a control pool of the fluid moving device and increase the reference temperature setpoint of the plurality of sensors in response to the master sensor being identified as being in at least one of a reverse fluid flow location and a non-operating section of the rack.

14. The system according to claim 12, wherein the structure comprises a data center housing a rack, wherein the controller is to:
- determine whether a difference in temperature between the temperature of the master sensor and temperatures of sensors in a neighboring vicinity of the master sensor is greater than a predetermined value; and
- in response to a determination that the difference in temperature is greater than the predetermined value, the controller is further to determine whether the master sensor is at least one of located at an exhaust of the rack and in a non-operating section of the rack and to remove the master sensor from a control pool of the fluid moving device in response to the master sensor being at least one located at an exhaust of the rack and in a non-operating section of the rack.

15. A non-transitory computer readable storage medium on which is embedded one or more computer programs, said one or more computer programs implementing a method for determining a substantially optimized fluid flow distribution in structure configured to be cooled by a fluid moving device, said one or more computer programs comprising a set of instructions, that when executed by a processor, cause the processor to:
- output an indication to activate the fluid moving device according to a reference temperature setpoint of a plurality of sensors;
- receive conditions detected in multiple areas of the structure with the plurality of sensors;
- identify a master sensor among the plurality of sensors based upon the detected conditions; and
- determine a master reference temperature setpoint for the master sensor that substantially optimizes fluid flow distribution in the structure based upon the conditions detected by the plurality of sensors in response to changes in a characteristic of fluid flow supplied to the plurality of sensors.

* * * * *